United States Patent [19]
Vadasz et al.

[11] Patent Number: 5,105,557
[45] Date of Patent: Apr. 21, 1992

[54] SYSTEM FOR RAPIDLY DRYING PARTS

[76] Inventors: Jozsef T. Vadasz, 288 Main St., Danbury; Howard M. Layton, Lazy Acres, Satterlee Rd., New Fairfield, both of Conn. 06810

[21] Appl. No.: 667,635

[22] Filed: Mar. 11, 1991

[51] Int. Cl.$^5$ ............................................. F26B 5/14
[52] U.S. Cl. ........................................ 34/14; 34/17; 34/60; 34/164
[58] Field of Search ............... 34/164, 60, 219, 17, 34/28, 14

[56] References Cited

U.S. PATENT DOCUMENTS

| | | | |
|---|---|---|---|
| 3,295,492 | 1/1967 | Schink | 34/164 |
| 3,710,450 | 1/1973 | Figiel | 34/60 |
| 3,861,061 | 1/1975 | Ross | 34/164 |
| 4,597,190 | 7/1986 | Camerini | 34/164 |
| 4,876,801 | 10/1989 | Gehring et al. | 34/164 |

Primary Examiner—Henry A. Bennet
Assistant Examiner—Denise L. F. Gromada
Attorney, Agent, or Firm—Michael Ebert

[57] ABSTRACT

A system for drying microelectronic, optical and other parts which are rendered wet in the course of their processing, the system functioning rapidly to dry these parts so that they are free of contaminants. The system includes a drying chamber having a work zone in which the wet parts are held in a removable carrier resting on a stand, the work zone being heated to promote evaporation. Flowing through the work zone and passing over the wet parts is a gaseous stream which entrains vapors emitted from the parts and discharges the vapors from the chamber. To accelerate the evaporative process, a vibration generator is operatively coupled to the stand or to a vibration coupling device to impart vibrations thereto which are transmitted to the wet parts in the carrier, causing liquid drops on the surfaces of the parts to fractionate into droplets or to otherwise disperse and spread the liquid over a larger area, thereby greatly increasing the aggregate exposed surface area of the liquid.

20 Claims, 2 Drawing Sheets

SYSTEM FOR RAPIDLY DRYING PARTS

BACKGROUND OF INVENTION

1. Field of Invention

This invention relates generally to systems for drying microelectronic, optical and other parts which are rendered wet in their processing, and more particularly to a system of this type in which vibrations are imparted to the parts to be dried to cause liquid drops thereon to fractionate into fine droplets or to otherwise disperse and spread the liquid over a larger area, thereby accelerating the rate at which evaporative drying takes place.

2. Status of Prior Art

The concern of this invention is with the drying of microelectronic, optical, surgical and other manufactured parts which are rendered wet in the course of their processing. Drying is effected by evaporation which is the transition from the liquid to the gaseous or vapor state that occurs at the exposed surface of the liquid.

Evaporation arises from the motions of the molecules of the liquid which are held together by mutual molecular attraction. Within the body of the liquid, the molecules, on the average, are subjected to no force tending either to drive the molecules toward the exposed surface of the liquid or more deeply into its body. Those molecules near to or approaching the exposed surface may be caught and pulled back by intermolecular forces. However, the velocity distribution of these molecules is such that the more energetic molecules will break through the surface and evaporate into the surrounding atmosphere. Evaporation is induced by heat, for as the temperature of the liquid goes up, then more molecules attain the critical level of kinetic energy required for their escape. And if the heat is applied by way of a gaseous stream flowing at high velocity over wet surfaces of the parts, this wind entrains the vapors emitted from the parts, thereby enhancing the evaporative process.

The evaporation of a given mass of any liquid dictates a definite quantity of heat, this quantity being dependent on the nature of the liquid and the temperature at which it will evaporate. The quantity required per unit mass is referred to as the heat of vaporization of the substance at that temperature. Inasmuch as the most energetic molecules are the first to escape by evaporation, the average kinetic energy of those remaining in the liquid mass diminishes. As a consequence, the process of evaporation is always accompanied by cooling, and for the evaporative process to continue, additional heat must be supplied to the liquid.

But regardless of whether liquid evaporation is induced by heat, a partial vacuum in the chamber containing the liquid or by a gaseous stream flowing over the wet surfaces of the parts, the rate of evaporation is a function of the area of liquid exposure.

The rate of evaporation per second and per unit area varies for different liquids. Thus a highly volatile solvent evaporates more quickly than water. But regardless of the nature of the liquid, if a relatively large single drop of this liquid is to be evaporated, then most of its molecules lie within the mass and relatively few at the surface; hence evaporation from the drop which is a function of its exposed surface area will be slow. But if the same drop is shattered into a plurality of fine droplets, then the aggregate area of surface exposure is far greater and evaporation will now take place at a far more rapid rate.

The present invention resides in a drying system that exploits the greater surface area obtained by fractionating the liquid drops wetting the parts to be dried. The terms "liquid drop" and "droplets" as used herein are relative. Thus a drop may be a small mass of liquid, but however small, a droplet is much smaller.

In fabricating integrated circuit silicon wafers, optical lenses, computer components, surgical instruments and other parts, one or more cleaning and drying processes are usually involved. These parts in the course of their processing are rendered wet with the solvents or other liquids, and in order to achieve optimal cleanliness and a high yield of uncontaminated parts, it is vital that the wet parts be subjected to uniform treatment throughout the work zone of a drying chamber or vessel. To this end, the prior patent to Layton, U.S. Pat. No. 3,543,776, discloses a heated process vessel for drying wet microelectronic parts with a continuously flowing stream of inert gas, the parts to be dried being held in a removable basket or other work carrier placed on a stand or otherwise supported within the work zone of the vessel.

For most critical parts drying operations, use is made of a flowing stream of ultrapure air or an inert gas such as nitrogen, infrared radiant heating, a partial vacuum, or a combination of these expedients, to promote drying of the parts. When the liquid to be evaporated from the surface of the parts is a highly volatile fluorinated or chlorinated hydrocarbon solvent having fast drying characteristics, then vapor-zone drying is the dominant choice in general parts drying applications.

However, in recent years, environmental protection regulations imposed on industry have mandated a marked reduction in the use of CFC and other volatile solvents that adversely affect the environment.

Since many liquids currently used in processing parts have relatively slow drying characteristics, the need has arisen for an efficient parts drying system for parts wetted with such liquids capable of carrying out drying operations at rates comparable to those obtained with conventional systems adapted to dry parts wetted by a fast drying solvent.

Commercially available parts drying systems, such as those making use of a flowing gas stream, infrared radiant heating or other heating expedients, or vacuum or freeze-drying techniques, while generally effective in preserving the cleanliness of the parts during drying, are, by and large, unable to match the drying rate or speed of the volatile solvent vapor-zone drying systems. Hence it has heretofore been the practice, when the liquid to be dried lacks fast drying properties, to use two or more drying units for this purpose.

SUMMARY OF INVENTION

In view of the foregoing, the main object of this invention is to provide an improved system for drying microelectronic, optical and other parts which in the course of their processing have been rendered wet, the system functioning at a rapid rate to completely dry the parts so that they are free of contaminants.

More particularly, an object of this invention is to provide a system of the above type which includes means to subject the wet parts to be dried to vibratory forces that act to fractionate the drops of liquid on the surface of the parts into fine droplets or to otherwise disperse and spread the liquid over a larger area, whereby the aggregate exposed area of the liquid is far greater than that of the drops, as a consequence of which evaporation drying proceeds at a much faster pace.

Also an object of the invention is to provide a system of the above type in which the vibratory rate and amplitude of the vibratory forces applied to the liquid drops are adjustable so as to attain optimum conditions conducive to drop fractionation.

Yet another object of the invention is to provide a system of the above type in which the vibrating parts in the drying chamber are concurrently exposed to a laminar gas stream to effect uniform drying of the parts.

Briefly stated, these objects are attained in a system for drying microelectronic, optical and other parts which are rendered wet in the course of their processing, the system functioning rapidly to dry these parts so that they are free of contaminants. The system includes a drying chamber having a work zone in which the wet parts are held in a removable carrier resting on a stand, the work zone being heated to promote evaporation. Flowing through the work zone and passing over the wet parts is a gaseous stream which entrains vapors emitted from the parts and discharges the vapors from the chamber.

To accelerate the evaporative process, a vibration generator is operatively coupled to the stand or other vibration coupling device to impart vibrations thereto which are transmitted to the wet parts, causing liquid drops on the surfaces of the parts to fractionate into droplets or otherwise disperse and spread the liquid over a larger area, thereby greatly increasing the aggregate exposed surface area of the liquid.

DESCRIPTION OF INVENTION

Single Pass Parts-Drying System

Figure 1:
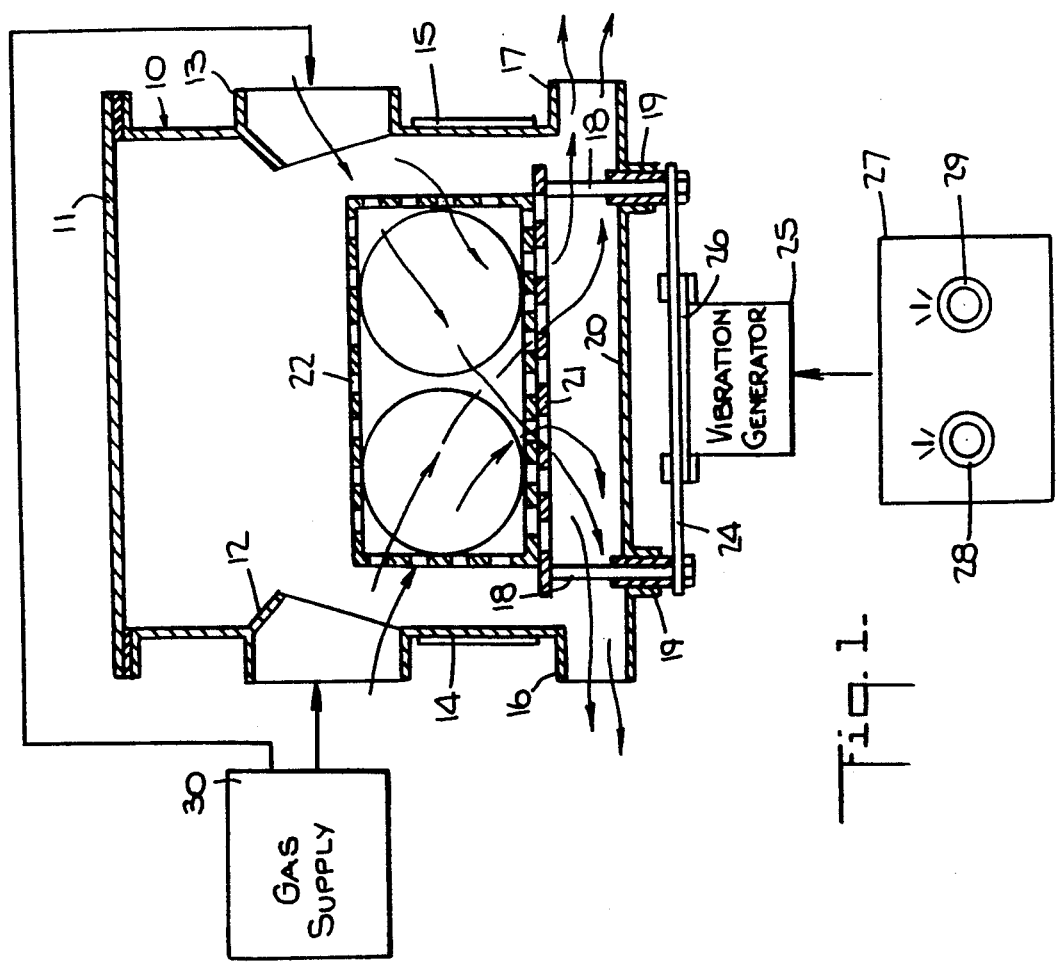
FIG. 1 schematically illustrates a single pass parts-drying system in accordance with the invention in which vibrations are imparted to a stand on which the parts carrier is supported.

Referring now to FIG. 1, there is shown a single pass parts-drying system in accordance with the invention in which the drying process is accelerated by an associated generator of vibrational energy which functions to fractionate the liquid drops on the surfaces of the parts.

The system includes a box-like drying chamber 10 having a removable cover 11 and directional gas inlet ports 12 and 13 disposed at an intermediate position on opposite side walls of the chamber. Attached to the opposite side walls below the inlet ports are external electrical heating elements 14 and 15. When energized, these heaters act to raise the temperature of the environment within the chamber to an elevated level to promote evaporation. In practice, these heater elements may be thermostatically controlled to maintain the chamber at a desired temperature level.

The chamber is further provided below the electrical heaters and adjacent its base plate 20 with a gas outlet 16 on one side wall and a gas outlet 17 on the opposing side wall. Thus the gas inlets and outlets are symmetrically arranged with respect to chamber 10.

Supported on the upper ends of vertical rods 18 which pass through bushings 19 in base plate 20 is a work-stand 21 formed of a metal grid or a perforated plate permeable to gas. Resting on work stand 21 is a basket or work carrier 22 formed of wire mesh or similar gas-permeable material. Held within work carrier 22 are the wet parts 23 to be dried. In practice, the work carrier is admitted into chamber 10 after removing its cover 11, and the cover is then put back to enclose the carrier within the chamber.

Attached to the lower ends of rods 18 is a vibration transmission plate 24 which is parallel to base plate 20 of the drying chamber. Depending from the vibration transmission plate is a vibration generator 25. A compliant diaphragm 26 is interposed between the vibration generator and plate 24, the diaphragm being bolted to plate 24. Vibration generator 25 is energized by a power generator 27 having a control knob 28 for varying the operating frequency of the generator and a control knob 29 for varying the amplitude of the generated wave.

In practice, vibration generator 25 may be a ballistic-type electromagnet vibrator such as that disclosed in the Herzl U.S. Pat. No. 4,756,197, in which a movable mass formed by a permanent magnet is free to reciprocate axially within the confines of an electromagnet stator coupled to a power generator whose operating frequency determines the vibratory rate of the reciprocating mass which is excited into vibration.

Fed continuously into inlet ports 12 and 13 on opposite sides of the chamber from a pressurized gas supply 30 are streams of ultrapure air or an inert gas such as nitrogen. The inlet ports are oriented to direct the incoming streams of gas, as indicated by the gas flow arrows, onto opposite sides of work carrier 22. In flowing over the wet parts, the streams entrain vapor emitted therefrom. The entrained vapors in the gas streams flow through the gas-permeable work stand 21 on which carrier 22 rests, and from there the streams pass out of outlet ports 16 and 17 to be discharged into the atmosphere or into a vapor collector which condenses the vapor and absorbs the liquid for purposes of disposal.

As this evaporative action is taking place, vibrations are being transmitted by transmission plate 24 to work-stand 21 and from work-stand 21 to work carrier 22. These vibrations are imparted to the parts 23 held in the carrier and to the liquid drops wetting the surfaces of the parts. In order to isolate chamber 10 from the vibratory forces, the bushings 19 surrounding the vibration-transmitting rods are preferably of elastomeric material, so that the vibratory force is not conducted through the bushings to the chamber walls.

It is desirable that the vibratory rate of the vibratory force be such as not to approach the natural resonance frequency of the solid structures through which the vibrations are conveyed; that is, the work-stand and the work carrier. Should these structures, which have natural resonance frequencies, be excited into sympathetic vibration, much of the applied vibratory force will then be dissipated.

On the other hand, it is desirable but not essential that the vibratory rate of the vibrations or harmonics thereof which are determined by power generator 25 be such as to approach or approximate the natural resonance frequency of the parts or of the liquid drops, for then the drops are excited into sympathetic vibration, and this will cause them to shatter more quickly; that is, to fractionate or atomize into fine droplets. The aggregate exposed surface area of these droplets is far greater than that of the drops from which the droplets are derived, thereby greatly accelerating evaporation.

The geometry of a water drop on a solid surface depends on the wettability of this surface. In general, each water drop on the surface tends to assume a hemispherical shape whose outer surface area relative to its volume is small, for among all possible drop shapes, the smallest volume is occupied by a sphere. From the standpoint of evaporation, this is highly disadvantageous.

If the need exists to evaporate water drops from a smooth surface that has poor wettability and therefore is one to which water will not adhere, then, due to surface tension, each drop will assume a shape approaching that of a sphere. Spheroidal drops take even longer to dry than hemispherical drops.

Should the parts to be dried or their carriers have surfaces that include corners, crevices, narrow slits or deep holes, these act to create larger liquid drops, thereby decreasing their exposed surface area and making drying more difficult.

While one can reduce the time it takes to dry wet parts by raising the temperature of the drying chamber, this temperature cannot be safely increased beyond the tolerance level of the parts to be dried. The present invention effects drying at an accelerated rate at a temperature within an acceptable range by enlarging the surface area of the liquid to be evaporated. The mathematical relationship between surface area and drying time will now be explained with respect to a typical water drop having a hemispherical shape.

The surface area F of this drop is expressed by the following equation:

$$F = \frac{4 \cdot r^2 \cdot \pi}{2}$$

where r is radius.

The volume V of this drop is expressed by the following equation:

$$V = \frac{4 \cdot r^3 \pi}{3.2}$$

The unit value of the free surface of a hemispherical water drop relative to its value is as follows:

$$\frac{F}{V}$$

Substituting from the above equations $$\frac{F}{V} = \frac{4 \cdot r \pi \cdot 3 \cdot 2}{2 \cdot 4 \cdot r^2 \pi} = \frac{3}{r}$$

Therefore, as the radius r of the water drop is decreased the $$\frac{3}{r} \text{ proportion}$$

proceeds to grow giving rise to a reduction in drying time.

The table below gives the ratio of $$\frac{F}{V} = \frac{3}{r}$$

for water drops in a range of diameters D (=2r) for water drops.

TABLE

| D = 2r − 0.1 | 0.06 | 0.03 | 0.02 | 0.001 | 0.006 | 0.003 | 0.002 |
|---|---|---|---|---|---|---|---|
| $\frac{F}{V} = \frac{3}{r} - 60$ [sq. inch / cu. inch] | 100 | 200 | 300 | 600 | 1000 | 2000 | 3000 |

Thus if we start with a water drop having a diameter of 0.1 inches and fractionate this drop into droplets each having a diameter of 0.02 inches which is one-fifth of the original diameter, then with respect to the relationship $$\frac{F}{V} = \frac{3}{r}$$

the values become:

$$\frac{3}{0.05} \quad 60 \frac{\text{sq. inches}}{\text{cu. inches}}$$

$$\text{This becomes } \frac{3}{0.01} = 300 \left[ \frac{\text{sq. inches}}{\text{cu. inches}} \right]$$

Hence the exposed surface area of the liquid relative to its volume grows by a factor of 5. Disregarding minor factors, it can generally be stated that the quantity of the water evaporated from a liquid at a constant temperature and pressure is inversely proportional to the area of its exposed surface. Hence to effect rapid drying, one must strive to maximize the relationship of this surface to the volume of the liquid. In a method and system in accordance with the invention, this is accomplished by subjecting the wet parts to vibratory forces which fractionate the drops into droplets or act to otherwise disperse and spread the liquid over a larger area.

A part that is free to move and is subjected to a vibratory force accelerates or speeds up and decelerates or slows down between its two resting points. From one of these resting points until its middle position, the part accelerates and it then decelerates toward its second point. If the vibrating part is wet, then the liquid drops that cling thereto are also accelerated and decelerated, and the resultant mass forces overcome their cohesive molecular forces and their adhesive forces which cause the drops to cling to the parts. As a consequence, the liquid drops are torn off the surface of the vibrating part and are displaced from crevices, holes and slits. And the drops are fractionated or the liquid is otherwise dispersed and spread over a larger area, thereby causing evaporation to take place at a greatly increased rate.

Drying time is strongly influenced by the vibratory rate or frequency. Also influential are the geometry of all components that participate in this vibration and the mechanical connections therebetween which affect the amplitude and direction of the vibrations imparted to the parts being dried. The characteristic of the mechanical connection can encompass an extreme in which the parts are tightly held together and have zero freedom of movement all the way to freedom in three dimensions and three rotational axes. But in such situations, the rate of evaporation from a liquid surface is a function of its area of exposure, the greater this area, the more rapid the rate of evaporation.

The natural resonance frequency of the liquid drops or of the parts in any given situation cannot readily be determined. But it can be arrived at empirically by varying the frequency of power generator 27 to determine at which frequency the resultant acceleration of the rate of evaporation attains its maximum level. The amplitude of vibrations is, of course, also a factor in regard to the rate of evaporation; for the greater the amplitude the greater is the tendency of the vibratory force to shatter the drops. The appropriate amplitude level for any given situation is also determined empirically.

It is to be understood that the drying system shown in FIG. 1 is by no means the only system capable of carrying out the invention. Many alternative chamber designs are possible where regardless of the environmental conditions which exist to promote evaporation and regardless of the nature of the heaters or the flow stream, the invention will be realized when the drying chamber includes means to subject the parts being dried to vibration to fractionate the liquid drops wetting the parts and thereby accelerate the evaporative process. In practice, the periodic wave pattern of the vibrations is preferably in a pulsatory, non-sinusoidal form, so that it is rich in harmonic components.

The selection of an optimum vibrational frequency or combination of frequencies is in great measure influenced by the geometry of all of the components that take part in the vibrational chain between the vibration generator and the parts to be dried. The selection of a suitable mode of operation will therefore typically be made empirically. In practice, the frequency and amplitude of the applied vibrational energy will be selected so as to achieve a vibration of the parts and its carrier that represents a compromise between the requirement for optimum fractionation of the water drops on the surfaces and the need to avoid the risk of damage to the parts.

In practice, we have found that rapid drying can best be effected at vibratory rates in a range of about 20 to 200 Hz. However, in certain applications we have found a vibratory rate of ½ Hz to be effective, while in other applications a rate as high as 5000 Hz has proven to be desirable. The amplitude of vibration can be controlled with the aid of a compliance such as a silicone rubber pad interposed between the vibration generator and the means transferring the vibrations to the parts carrier. Because the optimum vibration frequency for any given drying application is determined empirically, a vibration generator, which is adjustable in frequency and amplitude, will provide the necessary flexibility.

Recirculating Parts-Drying System

In the system disclosed in FIG. 1, the arrangement is such that the gaseous stream admitted through inlet ports on opposing walls of the drying chamber impinge on opposite sides of the work carrier to create an intersecting flow pattern. As a consequence, some degree of turbulence is encountered and relatively stagnant pockets of gas may be developed within the chamber. These effects militate against uniform evaporative drying of the parts. Moreover, since the heated gas stream in which the vapors are entrained, are discharged from the chamber, there is a resultant waste of thermal energy.

Figure 2:
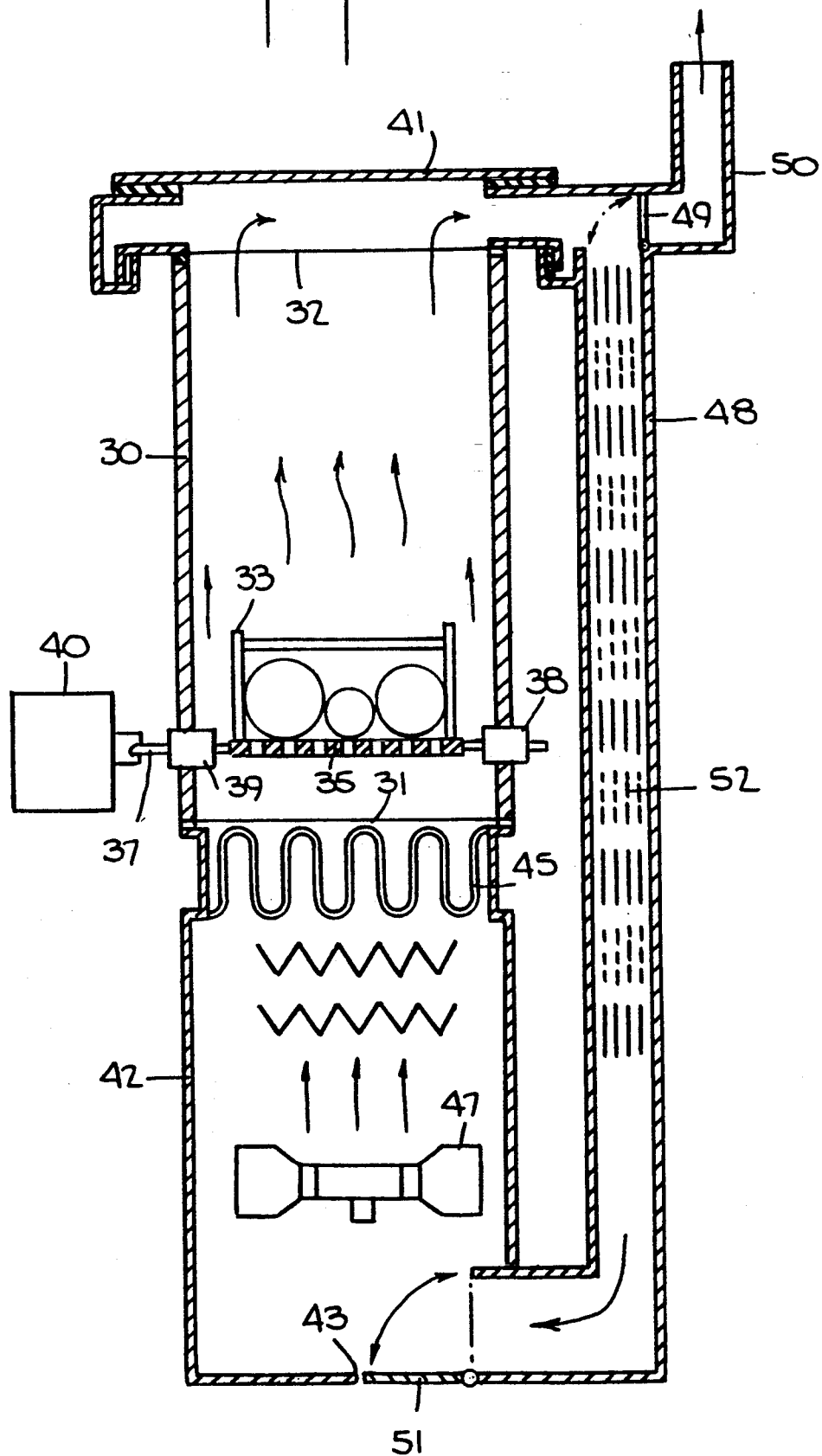
FIG. 2 schematically illustrates a recirculating parts-drying system according to the invention in which vibrations are imparted to a stand on which the parts carrier is supported.

In the recirculating parts-drying system shown in FIG. 2, the heated gas stream flowing through the drying chamber is substantially laminar and free of turbulence, so that uniform drying of the parts takes place. And because the heated gas stream is recirculated in the chamber after the moisture is extracted therefrom, this acts to conserve thermal energy.

The system shown in FIG. 2 includes an open-ended drying chamber 30 having a rectangular cross section, the lower end 31 defining a gas inlet and the upper end 32 a gas outlet. Disposed in a work zone within the drying chamber between its side walls and above its inlet is a removable gas-permeable basket or work carrier 33 holding the wet parts to be dried. Work carrier 33 rests on a gas-permeable work stand 35 supported from its opposing edges which are spaced from the chamber walls by rods 36 and 37 so that the stand is free to vibrate. Rod 36 extends through a bushing 38 in one side wall, and rod 37 through a bushing 39 in the opposing side wall, this rod being linked to an external motor-driven vibrator 40. The bushings are preferably of silicone rubber so that no vibrations are conveyed from the rods to the walls of the chamber.

Because of this arrangement, as indicated by the flow arrows, gas flows through and around the work zone from inlet end 31 to outlet end 32, above which the gas is intercepted by a baffle 41 spaced from the outlet end, the gas being then outwardly deflected.

Coupled to the lower end of drying chamber 30 is a pressure chamber 42 having at its base an input port 43, into which atmospheric air or gas is admitted. Mounted at the upper end of pressure chamber 42 is a box-like Hepa filter unit 45 which fully covers inlet 31 of the drying chamber and therefore acts to intercept the air or nitrogen before the gas is permitted to pass into drying chamber 30.

A preferred form of Hepa filter is one composed of a continuous sheet of non-woven, non-combustible microglass fibers having high tensile strength and water-repellant properties. This non-woven sheet is accordion-folded over narrow fluted corrugated aluminum separators supported within a frame and bonded thereto by sealants. Also provided are gaskets on either face of the frame to form a leak proof seal at the air exit and entry faces of the filter unit.

A commercial Hepa filter unit of this type is available commercially under the trademark MICROFLOW filter from the High Efficiency Filter Corp. of Eatontown, N.J. While a standard Hepa filter unit can withstand temperatures as high as 220° F., in the context of the present invention in which the air or nitrogen gas is heated to as high as 200° C. in order to promote rapid evaporation, it is essential that the Hepa filter unit be capable of functioning at elevated temperatures. To this end, the unit is provided with sealants, gaskets and frames fabricated of materials capable of withstanding the elevated temperatures.

Because pressure chamber 42 is enclosed by Hepa filter unit 45, gas or atmospheric air admitted into this chamber through input port 43 fills this chamber and uniformly subjects the entry face of the filter unit to distributed gas pressure. The gas is heated to an elevated temperature by a heater assembly 46 disposed below the filter. The heated gas passes through the Hepa filter unit which acts to filter out not only particles borne by the gas but also scale and oxidation particles originating at the heater assembly. Mounted below heater 46 is a low-pressure blower 47.

The heated gas emerges from the exit face of the filter unit as a laminar stream which flows through the drying chamber 30 from inlet 31 to outlet 32 thereof, and in doing so promotes a uniform evaporative drying of the parts supported in the work-carrier 33. Because the filter unit extends between the walls of the drying chamber, no stagnant pockets of gas are developed therein.

Also provided is a gas return duct 48, as well as an exhaust gate 49 which when closed, as shown in solid lines in the figure, blocks flow into an exhaust duct 50. In doing so, it opens a passage between outlet 32 of the drying chamber and the input end of return duct 48 whose output end leads into pressure chamber 42. Input port 43 of pressure chamber 42 is blocked when an inlet gate 51 is closed, as shown in solid line in FIG. 2.

But when inlet gate 51 is open, as shown in dashed line in FIG. 2, it then blocks the output end of gas return duct 48, in which case there is no recirculating loop. But when exhaust gate 49 is open, as shown in dashed line, to admit gas discharged from the drying chamber into exhaust duct 50, it then blocks entry into the input end of return duct 48. Thus in a recirculating mode which is in effect when the gates are in their solid line positions, the heated gas discharged from drying chamber 30 is returned to pressure chamber 42 and recirculated, thereby conserving thermal energy.

A desiccant bed 52 (or alternately an assembly of cooling coils) is installed in return duct 48 to extract vapor from the vapor-laden gas discharged from the outlet of drying chamber 30 so that returned to pressure chamber 42 is a dry hot gas or air stream.

As in the case of the first embodiment, the evaporative drying process is accelerated in that a vibratory force is applied to the drops of liquid on the surfaces of the wet parts to fractionate these drops and thereby increase the aggregate area of the exposed liquid surface. The vibratory rate may be such as to cause the wet parts to jiggle in its carrier, and in doing so to displace the parts so that the portions thereof at the bottom of the carrier to shift to positions affording better exposure to the air stream.

Suspended Carrier Parts-Drying System

In the system shown in FIGS. 1 and 2, the carrier for the wet parts rests on a stand disposed within a drying chamber, vibrations being applied to the stand which transfers these vibrations to the wet parts in the carrier.

In many drying systems, instead of resting on a stand, the wet part carrier is suspended by hooks or other means from a mechanical transfer hoist dedicated to the work load, for it stays with the load throughout the process.

Figure 3:
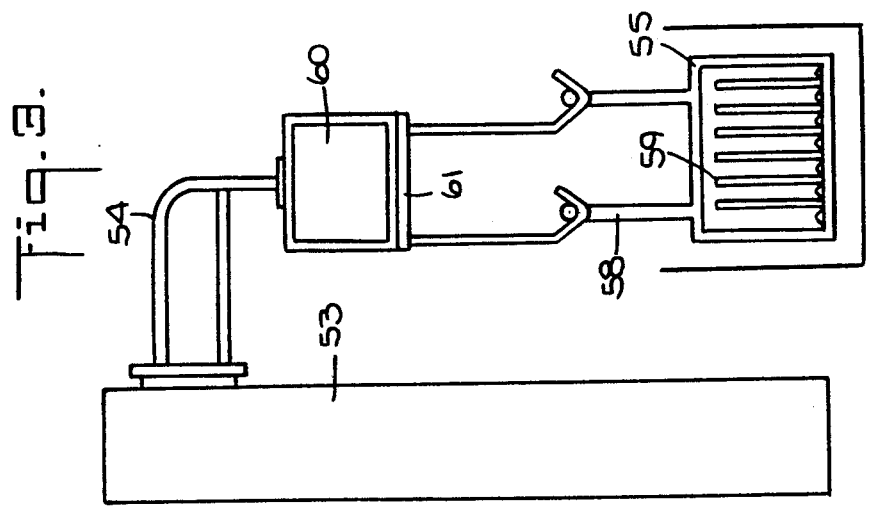
FIG. 3 schematically illustrates a parts-drying system in accordance with the invention in which vibrations are imparted to hooks from which the work carrier is suspended.

One such suspended carrier parts-drying system is shown in FIG. 3, the system including a mechanized transfer hoist 53 having a cantilever arm 54. A wet parts-carrier 55 is suspended within a drying chamber 56 by hooks 57 which engage the handles 58 of the parts carrier. The wet parts 59 held in carrier 55 may be lenses, silicon wafers, substrates, components or other processed parts that require drying.

To promote such drying the wet parts in the drying chamber may be subjected to a stream of heated air, as in the systems shown in FIGS. 1 and 2, to entrain vapor emitted from the wet parts.

In this instance, in order to accelerate the rate of drying, depending from the cantilever arm 54 of the hoist mechanism is a vibration generator 60 from whose output base depend the suspension hooks 57. A compliance pad 61 covers the output base of the vibration generator to effect amplitude control. Vibration generator 60 is adjustable in frequency and amplitude to provide a vibrational force which is optimized to effect drying.

Thus in this suspended carrier system the vibrations from vibration generator 60 are imparted to suspension hooks 57 through which they are transmitted to handles 58 of the carrier and through the carrier to the wet parts 59. These vibrations act to fractionate the liquid drops or to otherwise disperse and spread the liquid over a larger area to accelerate its evaporation.

Where the parts to be dried are lenses which are held vertically in grooves formed in a rack, then when the rack is subjected to a vibratory force, this has the effect of slowly rotating the lenses in their respective grooves and dispersing and spreading the drops on the lenses through the action of gravitational forces, thereby enlarging the area of liquid surface exposure and accelerating drying. In this arrangement (not illustrated), the lens rack is placed in a work stand within a drying chamber, and several fixed frequency powerful buzzers attached to the side of the work stand and acting in parallel, provide the necessary vibrational energy.

In another system in accordance with the invention, the parts to be dried are annular in form (such as plastic lens holders) and are suspended from hooks depending from a horizontal bar bridging the side walls of a work carrier resting on a work stand within a drying chamber. In this instance, the vibration generator is mounted above the carrier on a plate bridging the side walls of the carrier, so as to impart vibrations to the side walls which are transferred to the parts.

While there has been shown and described a preferred embodiment of a system for rapidly drying parts in accordance with the invention, it will be appreciated that many changes and modifications may be made therein without, however, departing from the essential spirit thereof. Thus instead of providing a vibration generator which is external to the drying chamber and is operatively coupled by a vibration coupling means to the stand on which the carrier rests, the vibration generator may be integrated or incorporated with the work stand, so that the vibration generator is disposed within the drying chamber. In practice, an armature in the form of iron slugs may be embedded in a stainless steel work stand surrounded by a field coil which when energized by an alternating current excites the armature into vibration.

We claim:

1. A system adapted to effect evaporative drying of microelectronic, optical and mechanical parts which in the course of their processing are rendered wet, drops of liquid lying on the surfaces of the parts, said system comprising:

(a) a drying chamber;
    (b) a removable work carrier containing the wet parts to be dried disposed within the chamber, said parts being held within the carrier with their wet surfaces separated from each other and exposed;

(c) a vibration generator providing a vibratory force;

(d) means to transmit said force to said carrier so that it is imparted to the parts therein, said force having a vibratory rate and amplitude causing the drops of liquid wetting the parts to fractionate into droplets which disperse and spread the liquid over a larger area whose aggregate exposed surface is far greater than that of the drops whereby evaporative drying of the liquid is accelerated; and (e) means to subject the parts in said chamber to a gaseous stream that flows past said wet surfaces to dry said parts.

2. A system as set forth in claim 1, wherein said generator is an electrically-energized vibrator coupled to a power generator.

3. A system as set forth in claim 1, wherein the carrier rests on a stand within the chamber and the vibratory force from the generator is applied to the stand.

4. A system as set forth in claim 3, in which the frequency of the generator is adjustable to a vibratory rate which is remote from the natural resonance frequencies of the stand and the carrier and approaches the natural resonance frequency of the liquid drops to excite the drops into sympathetic vibration.

5. A system as set forth in claim 3, wherein said stand and said work carrier are gas permeable, further including means to flow said gaseous stream through said chamber which passes through said stand and said work carrier to entrain vapor emitted from the parts held in the carrier.

6. A system as set forth in claim 5, wherein said gaseous stream is nitrogen.

7. A system as set forth in claim 1, further including an external heater coupled to said chamber to elevate the temperature of the atmosphere within the chamber to promote evaporative drying of the parts.

8. A system as set forth in claim 1, wherein said chamber is partially evacuated to promote evaporative drying.

9. A system as set forth in claim 1, in which the generator produces a vibratory force having harmonic components.

10. A system as set forth in claim 3, in which said stand is supported on the upper ends of vertical rods that pass through bushings in the base of the chamber, the lower ends being attached to a vibration transmission plate to which the vibrator is coupled.

11. A system as set forth in claim 1, in which said chamber is provided with opposing side walls and said stand is supported between said side walls on either side by horizontal rods extending through bushings in the walls, one of said rods being linked to said generator.

12. A system as set forth in claim 5, wherein said chamber is provided with opposing side walls, each having an inlet gas port into which said gaseous stream is fed, and an outlet gas port from which the stream is discharged.

13. A system as set forth in claim 1, further including a hoist having an arm cantilevered therefrom, said vibration generator depending from said arm and being coupled to hooks from which said carrier is suspended.

14. A system as set forth in claim 1, wherein said liquid is selected from a class consisting of water and solvents including methanol and isopropanol.

15. A system as set forth in claim 1, wherein said parts are circular and are held in grooves formed in a rack disposed within the work carrier, whereby said vibrations cause the parts to rotate and thereby disperse and spread the liquid thereon.

16. A system as set forth in claim 1, further including a compliant elastomeric material interposed between the vibration generator and the means to transmit the vibratory force to a carrier to control the amplitude of this force.

17. A method for rapidly drying microelectronic, optical and mechanical parts which have been rendered wet in the course of their processing, said method comprising the steps of:

(a) placing the wet parts to be dried on a vibratable carrier disposed within a drying chamber, said parts being held in said carrier at separated positions with their wet surfaces exposed;

(b) subjecting the wet parts in the chamber to an atmosphere having a temperature promoting the evaporative process;

(c) imparting vibrations to the carrier which are transmitted to the wet parts at a vibratory rate and with an amplitude causing liquid drops on the surface of the parts to fractionate into droplets which disperse and spread the liquid over a large area whose aggregate exposed surface is much greater than that of the drops from which they are derived, thereby accelerating the evaporative process; and (d) subjecting the parts in said chamber to a gaseous stream that flows past said exposed wet surfaces to dry said parts.

18. A method as set forth in claim 17, in which the parts are held in a gas permeable carrier and the atmosphere promoting the evaporate process results from a gaseous stream flowing over the wet parts to entrain vapors emitted therefrom.

19. A method as set forth in claim 17, in which said stream is directed to a laminar flow path passing through said carrier.

20. A method as set forth in claim 17, in which the vibratory rate approximately matches the natural resonance frequency of the drops and is removed from that of the carrier.

* * * * *